(12) United States Patent
Chen et al.

(10) Patent No.: US 6,232,193 B1
(45) Date of Patent: May 15, 2001

(54) METHOD OF FORMING ISOLATED INTEGRATED INJECTION LOGIC GATE

(75) Inventors: Chun-Yu Chen, Albuquerque, NM (US); Gilles Marcel Ferru, Cairon; Serge Bardy, Caen, both of (FR)

(73) Assignee: Philips Electronics North America Corporaiton, New York, NY (US)

( * ) Notice: Subject to any disclaimer, the term of this patent is extended or adjusted under 35 U.S.C. 154(b) by 0 days.

(21) Appl. No.: 09/640,110

(22) Filed: Aug. 15, 2000

Related U.S. Application Data

(62) Division of application No. 09/222,905, filed on Dec. 30, 1998, now Pat. No. 6,140,694.

(51) Int. Cl.[7] .............................................. H01L 21/8228
(52) U.S. Cl. ..................... 438/323; 438/309; 438/322; 438/324; 438/325
(58) Field of Search ................................... 438/309, 322, 438/323, 324, 325

(56) References Cited

U.S. PATENT DOCUMENTS

| | | | |
|---|---|---|---|
| 5,591,656 | * | 1/1997 | Sawada .................................. 437/31 |
| 5,661,066 | * | 8/1997 | Takemoto et al. .................... 438/329 |
| 6,008,524 | * | 12/1999 | Gomi .................................... 257/575 |

\* cited by examiner

Primary Examiner—Matthew Smith
Assistant Examiner—Craig P Lytle
(74) Attorney, Agent, or Firm—Ernestine C. Bartlett

(57) ABSTRACT

An integrated injection logic device is provided in which each collector of an I2L gate is isolated by a field oxide ("FOX"), or by other suitable isolation such as, for example, an isolation trench. The connection of the base to the collectors, between the base contact region and the bottom of the collectors, is made underneath the field oxide using a buried p type layer (TN3 in the Figures illustrating the invention). Because both silicide and heavy implant p+ implant is present at the base contact point only, the recombination current is reduced. This reduces the current loss when compared to the current loss of the known device. Additionally, current gain is also improved by placing a deep base implant close to the emitter of the upside own NPN transistor in the integrated logic device. The area of the base and the area of the collectors is decoupled, i.e. one can adjust the base to collector areas and the base contact area, independently to control the total base current, thus allowing more freedom in layout optimization of the I2L gate and allowing more freedom in optimizing the gain of the I2L gate.

1 Claim, 12 Drawing Sheets

FOX = FIELD OXIDE

CROSS SECTIONAL VIEW OF X-X'

CROSS SECTIONAL VIEW OF Y-Y'

METHOD OF FORMING ISOLATED INTEGRATED INJECTION LOGIC GATE

CROSS REFERENCE TO RELATED APPLICATIONS

This is a divisional of application Ser. No. 09/222,905, filed Dec. 30, 1998 now U.S. Pat. No. 6,140,694.

FIELD OF THE INVENTION

This invention relates to semiconductor devices, and more particularly to such devices including an integrated injection logic gate.

BACKGROUND OF THE INVENTION

With reference to FIGS. 1 and 2, there is illustrated a schematic of a basic integrated injection logic gate 10 which comprises a multi-collector upside down NPN transistor 11, and a lateral PNP transistor 12 serving as a current source. The collector 18 and the base 19 of the current source 12 are connected to the base 14 and emitter 8 of the upside down NPN transistor 11, respectively. The current source thereby injects carriers through the base region 19 of the lateral PNP transistor 12 into the base region 14 of the upside down NPN transistor 11. When integrated, the base 14 of the NPN transistor 11 is common to the collector 18 of the current source, and the base 19 of the current source is common to the emitter 8 of the NPN transistor. The emitter 9 of the current source 12 is the injector. In such devices, the common base 19 of the current source 12 and the emitter 8 of the NPN transistor 11 is a buried N layer 4 and epitaxial layer 8 that is connected to a supply voltage (ground). Normally, several collectors are required to implement logic functions. FIG. 2 illustrates a known I2L device with a I-substrate 2 and having a buried n+ region 4, an n-epitaxial region 8, having a deeply buried n region (DN) 6 with n+ region 7 formed thereon. The base 14 is located in the same active area as the collectors 13. A metal layer 17 is used to contact each of the collectors. The metal layer can be silicide provided over selected areas of the device in a salicided, i.e. a self-aligned silicide, bipolar process. A metal layer or silicide is often used to connect all of the p+ base regions on top of the silicon surface. A problem with a structure such as that illustrated in FIG. 2 is that there is recombination current in the salicided base region which causes current loss and adversely affects the current gain. For a bipolar process which does not have silicide in the process, if a heavily doped p+ implant is used to reduce the base resistance, the same current loss problem exists in the base region.

SUMMARY OF THE INVENTION

An object of this invention is to provide an integrated injection logic ("I2L") device in which the above enumerated problems associated with the conventional devices are obviated.

According to the invention, an integrated injection logic device is provided in which each collector of the I2L gate is isolated by a field oxide ("FOX"), or by other suitable isolation such as, for example, an isolation trench. As a result of said isolation, the collectors cannot talk to each other. The connection of the base to the collectors, between the base contact region and the bottom of the collectors, is made underneath the field oxide using a buried p type layer (TN3 in the Figures illustrating the invention). Because both silicide and heavy implant p+ implant are present at the base contact point only, (see FIG. 3B), the recombination current is reduced. This reduces the current loss when compared to the current loss of the known device. Additionally, current gain is also improved by placing a deep base (such as for example, TN3 implanted region 85) close to the emitter (such as for example, buried n layer 40). The area of the base and the area of the collectors is decoupled, i.e. one can adjust the base to collector areas and the base contact area independently to control the total base current, thus allowing more freedom in layout optimization of the I2L gate and allowing more freedom in optimizing the gain of the I2L gate.

Thus the objects of the invention are accomplished by removing the base region accompanying each collector region in the same active area, whereby the recombination current component is reduced and the gain of the I2L gate is enhanced. According to the invention, each collector of the I2L gate is substantially completely isolated within a gate by a field oxide and the base linkup is done underneath the field oxide with a remote contact. Therefore, an additional metal layer to connect all the base regions together is not required. This (i) avoids the need for an extra metallization to connect bases and (ii) reduces the recombination current in the prior art I2L gate associated with the base region accompanying the etch collector region, thereby increasing the gain for the improved device.

U.S. Pat. No. 4,433,471 discloses a method for the formation of high density memory cells using ion implantation techniques. In this process a thick oxide, not field oxide, is used to isolate different emitters; the base link is situated under the thick oxide, and the linkup between a LPNP and the base region appears to happen under the thick oxide. However, in such devices, polysilicon is not used and the device is devoid of polysilicon protection against the p+ implant going into the collector region. Therefore, the base implant must be done through photoresist. In addition, two base implants are used. One is deep and the other is a heavy p+ shallow implant to reduce the base resistance. However, this heavy p+ shallow base implant causes additional recombination current loss. Furthermore, DN implants are not used to isolate one memory cell from another, and the base width of the LNPN is determined by the thick oxide width, leading to much larger structures than envisioned and achieved herein.

DETAILED DESCRIPTION OF PREFERRED EMBODIMENTS

Figure 1:
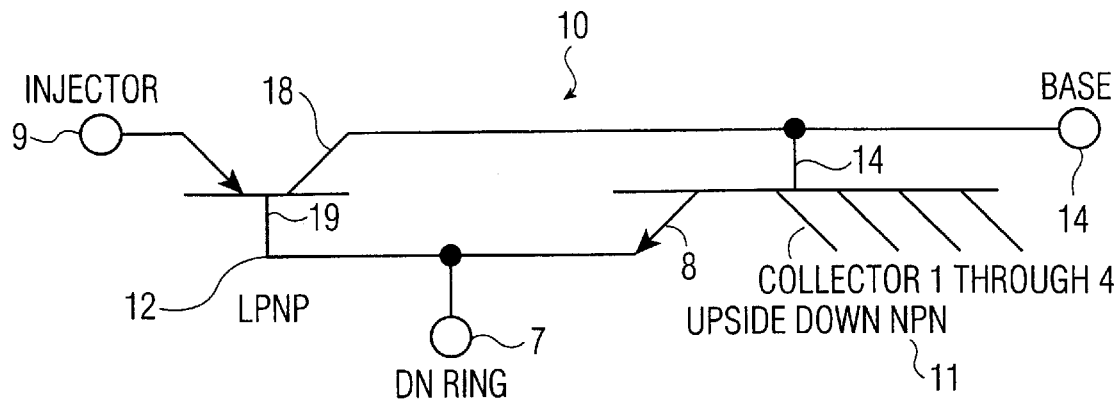
FIG. 1 is a schematic of an I2L injection logic gate.
Figure 2:
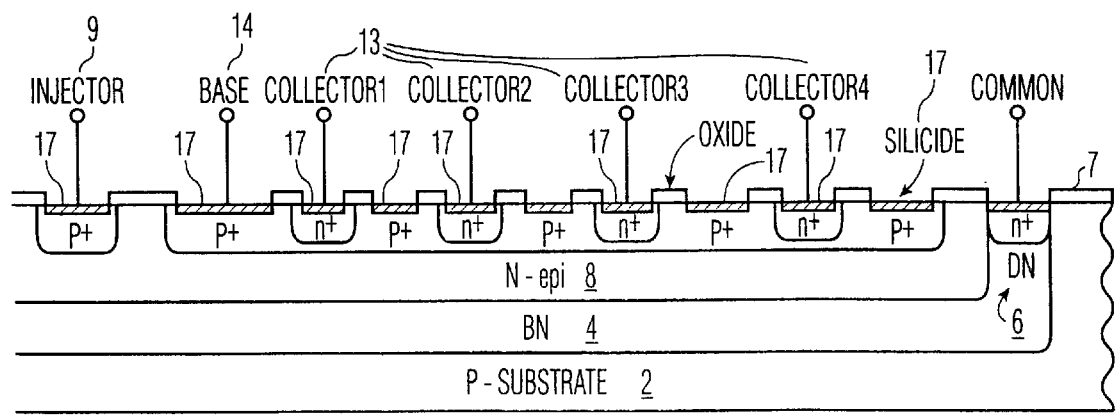
FIG. 2 is a sectional view of a prior art I2L gate having a p-type substrate.
Figure 3A:
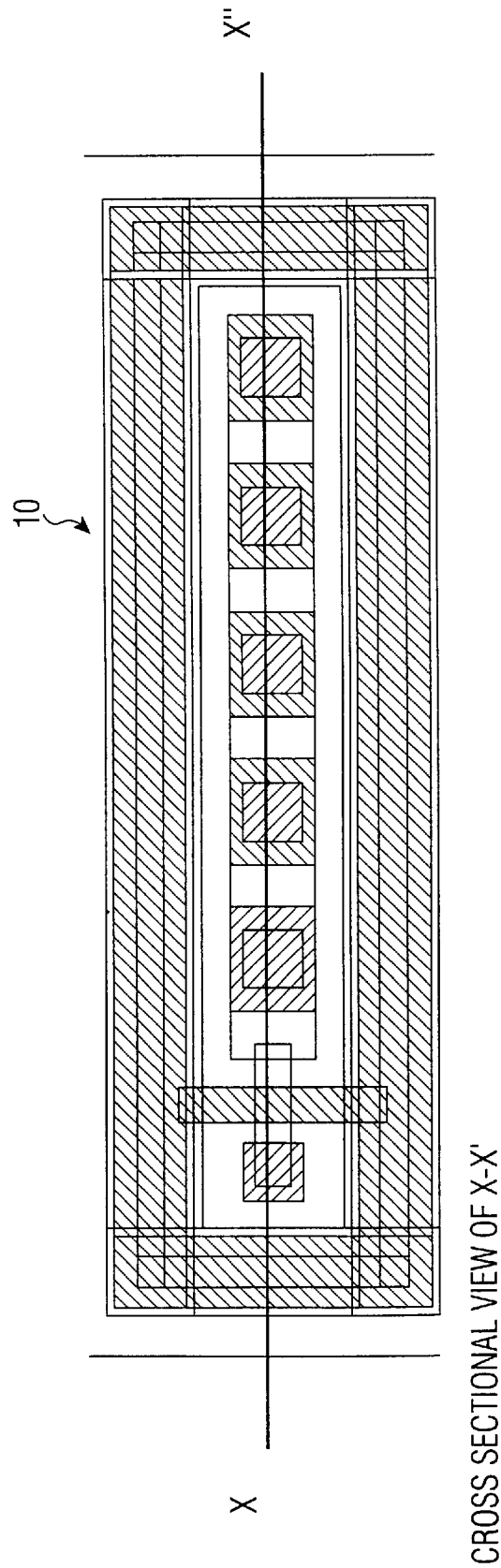
FIG. 3A is a top view of an I2L gate according to the invention.
Figure 3B:
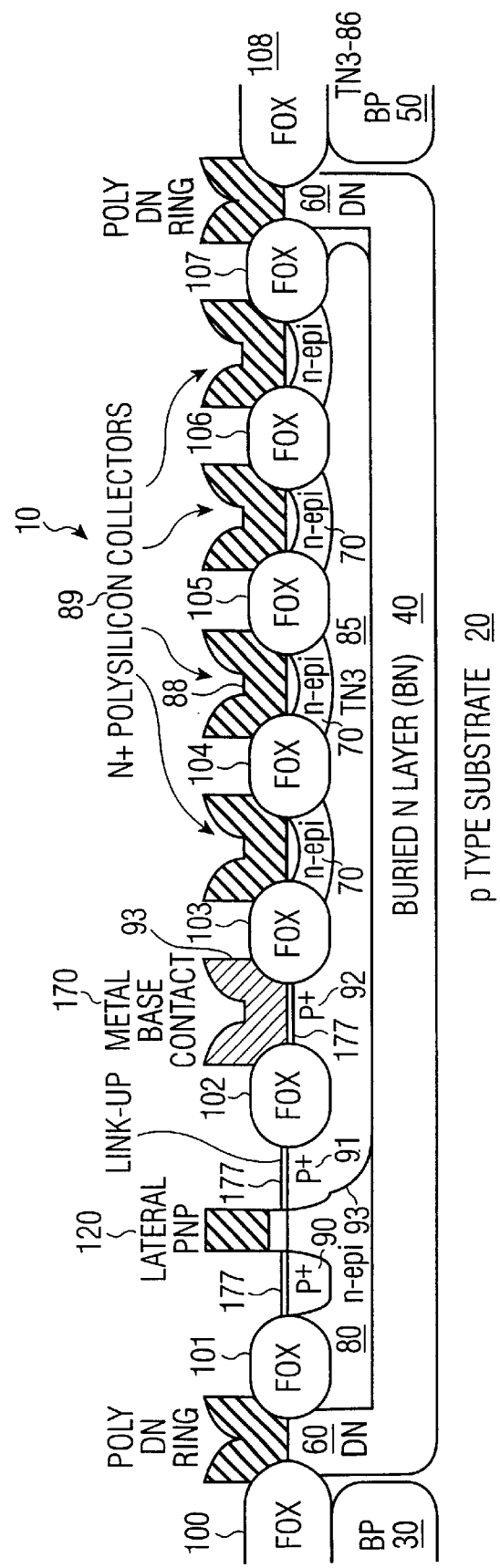
FIG. 3B is a sectional view of a portion of the I2L gate of the invention taken along the line X—X of FIG. 3A.

With reference to FIGS. 3A, 3B, 4A, 4B, and 5, there is illustrated a portion of a semiconductor device, preferably a field isolated intergrated injection logic gate 10 having a substrate of a first conductivity type, preferably a p-type silicon substrate 20; a buried layer of a second type conductivity, preferably of n-type conductivity 40 adjacent the substrate 20; buried regions of a first conductivity type, preferably buried regions of p-type conductivity 30,50 on each side of the buried layer of second type conductivity 40; a deeply buried region of a second conductivity type, preferably a DN region 60 adjoining the buried layers of second type conductivity 40 on each side thereof and forming the Poly DN ring for isolation and common ground; epitaxially grown silicon regions of a second conductivity, preferably of the n-type conductivity 70, 80; an implanted region of the first conductivity type, preferably a TN3 region 85; regions of the first conductivity, preferably shallow regions of the p+ type 90–92; field oxide regions 100–108 adjacent the poly DN ring, p+ regions 90–92 and n-epi regions 70, respectively; silicide layers 177 overlying the p+ regions 90, 91 and 92, and on top of the polysilicon regions (not shown in FIG. 3B; see FIGS. 6K–6R); a lateral PNP transistor 120 formed by p+ regions 90–91 and n-epi region 80; metal base contact 170 for the upside down NPN transistor 110 overlying silicide layer 177 and p+ region 92; an I2L device having multiple regions of the second conductivity type, preferably multiple n+ polysilicon collectors 89 of the upside down NPN transistor 110 adjacent multiple regions of the second conductivity type, preferably n+ regions 88 caused by n+ dopant outdiffusion from the n+ polysilicon regions, overlying the n-epi regions 70 isolated between the field oxide regions 103–108. It will be noted that each collector 89 of the I2L gate is isolated by a field oxide ("FOX") 103–107, and the connection of the base to the collectors, between the base contact region and the bottom of the collectors, is made underneath the field oxide using the buried p-type TN3 layer 85. It should also be noted that as a result of the TN3 implants, the area of the n-epi layer that underlies the p+ regions 91 and 92 is a p+ region. This region is indicated by 93 in FIG. 3B.

Figure 5:
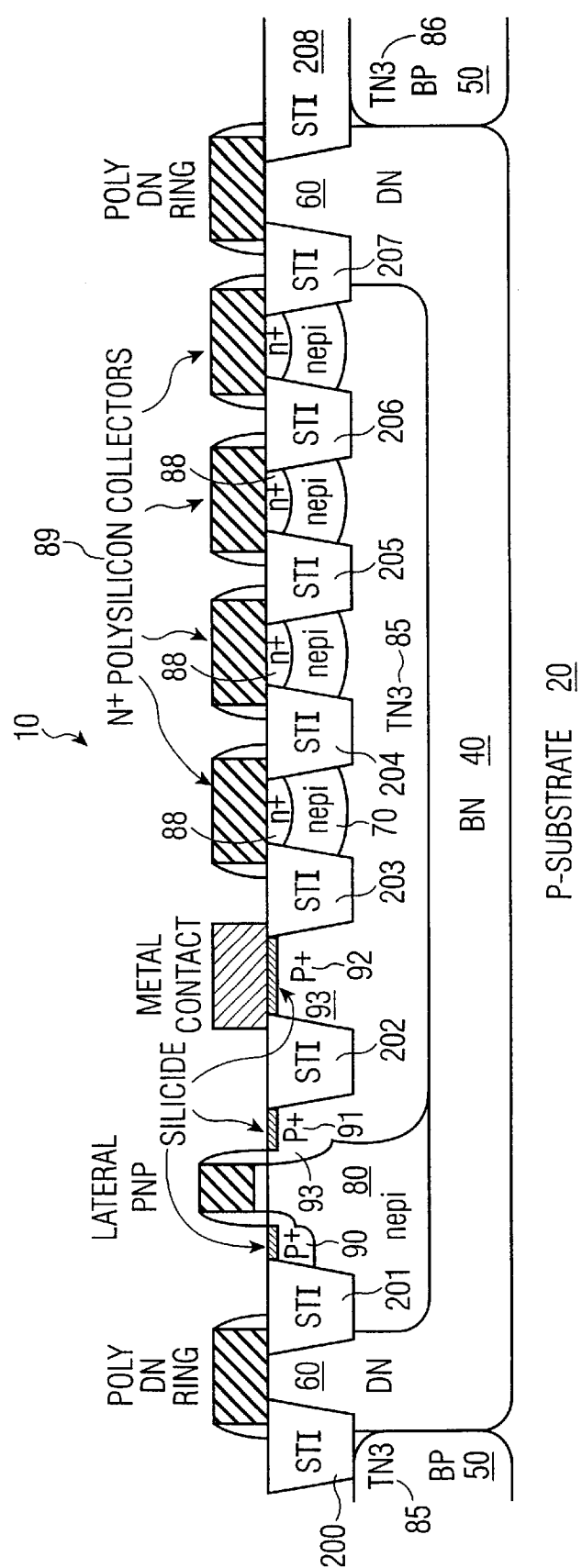
FIG. 5 is a sectional view of a portion of the I2L gate of the invention similar to FIG. 3B but illustrating an alternative embodiment of the invention.

In the embodiment illustrated in FIG. 5, polysilicon collectors 89 overlying the n-epi regions 70 are isolated between the shallow trench isolation (STI) regions 203–208. It will be noted that each collector 89 of the I2L gate is isolated by a shallow trench isolation region ("STI") 203–207, and the connection of the base to the collectors, between the base contact region and the bottom of the collectors, is made underneath the STI using the buried p-type TN3 layer 85.

Each collector of the semiconductor device is isolated, and preferably is completely isolated within a gate by a field oxide and the base linkup or connection is done underneath the field oxide with the remote contact 170. The area of the base and the area of the collectors is decoupled, i.e. one can adjust the base to collector areas and the base contact area independently to control the total base current, thus allowing more freedom in layout optimization of the I2L gate and allowing more freedom in optimizing the gain of the I2L gate.

Figure 4A:
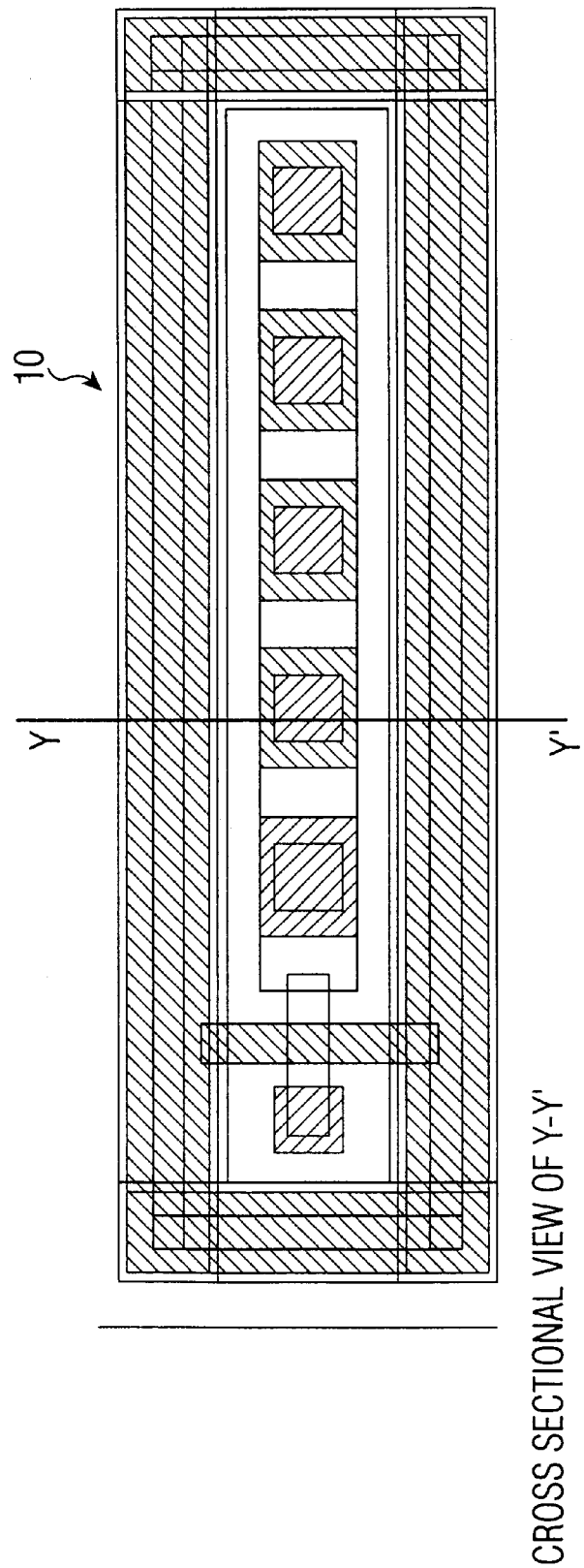
FIG. 4A is a top view of/a I2L gate according to the invention.
Figure 4B:
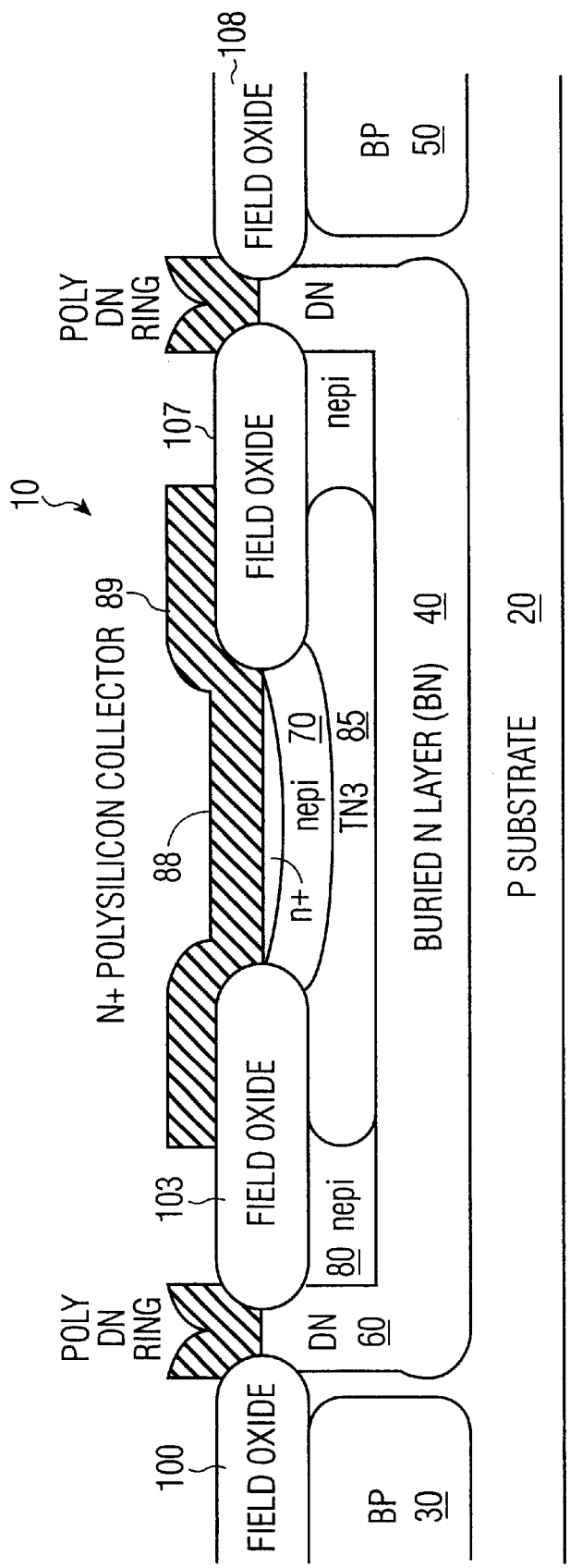
FIG. 4B is a sectional view of a portion of the I2L gate of the invention taken along the line Y—Y of FIG. 4A.

Such semiconductor devices may be obtained by a process which comprises the steps illustrated in at least FIGS. 6A–6L and preferably in 6A–6R as follows (wherein all of the FIGS. 6A–6R describing I2L devices are taken along the Y—Y axis of the I2L device through one of the n+ polysilicon multicollectors as illustrated in, for example FIG. 4A). These figures illustrate a method for the production of a portion of a semiconductor device including the portion illustrated in FIGS. 3–5 and also includes a regular NPN transistor 111.

Figure 6A:
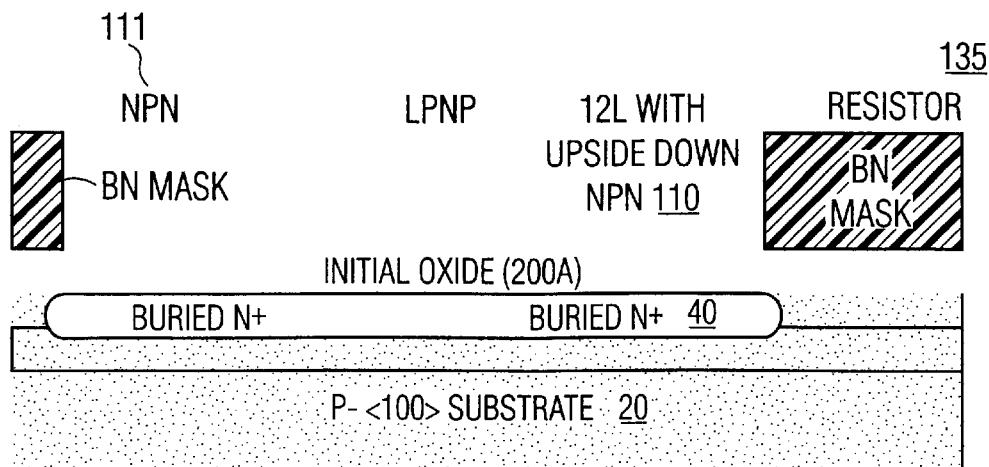
FIGS. 6A–6R schematically illustrate steps comprising a method utilized to prepare a preferred embodiment of the invention.

FIG. 6A: a silicon substrate of P-type conductivity 20 is provided, after the formation of an initial oxide layer, and using a zero oxidation mask and global alignment maker etch, and a buried N+ (BN) mask, an ion-implanted buried N+ region 40 is formed, after which the BN mask is stripped and the buried n+ region is annealed.

Figure 6B:
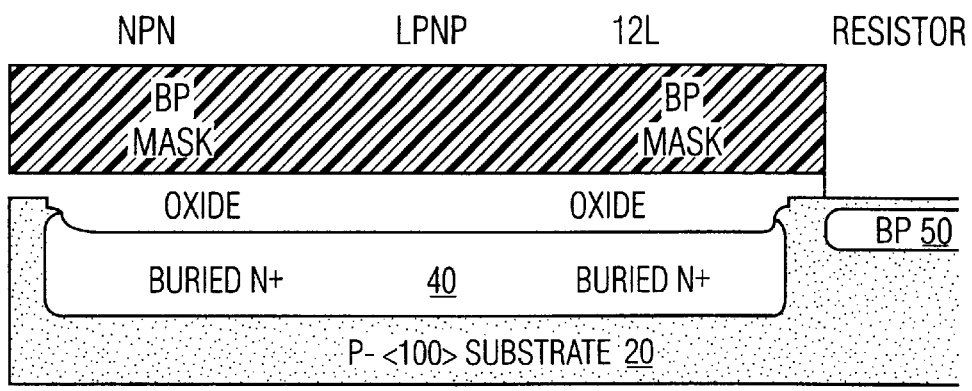

FIG. 6B: a buried P+ (BP) mask is applied, a BP etch and implant is conducted to form an ion-implanted BP region 50, the BP mask is stripped and a pre-epi etch performed to remove the oxides present on the surface.

Figure 6C:
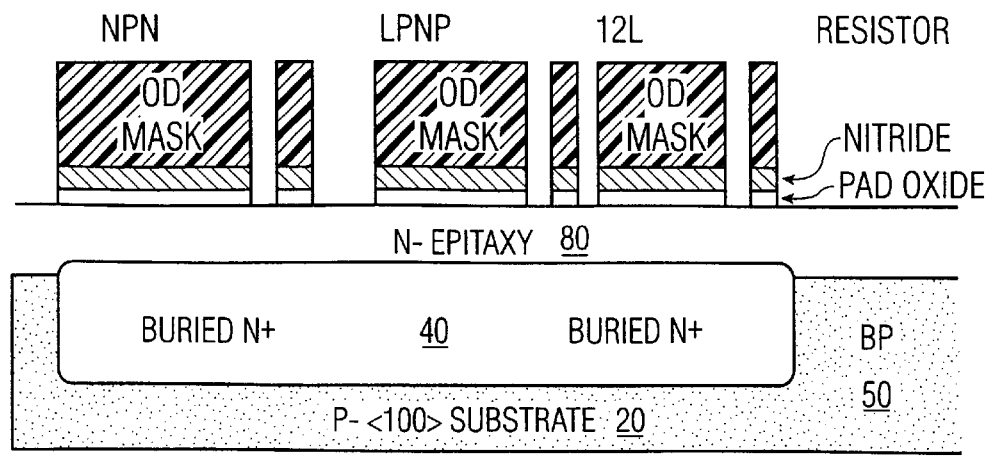

FIG. 6C: An N-epitaxial layer 80 is grown over the BN and BP regions 40 and 50. The resulting structure is subjected to PAD oxidation, silicon nitride deposition, an oxide definition mask (OD) is applied (defines active region edge) and an OD etch is performed.

Figure 6D:
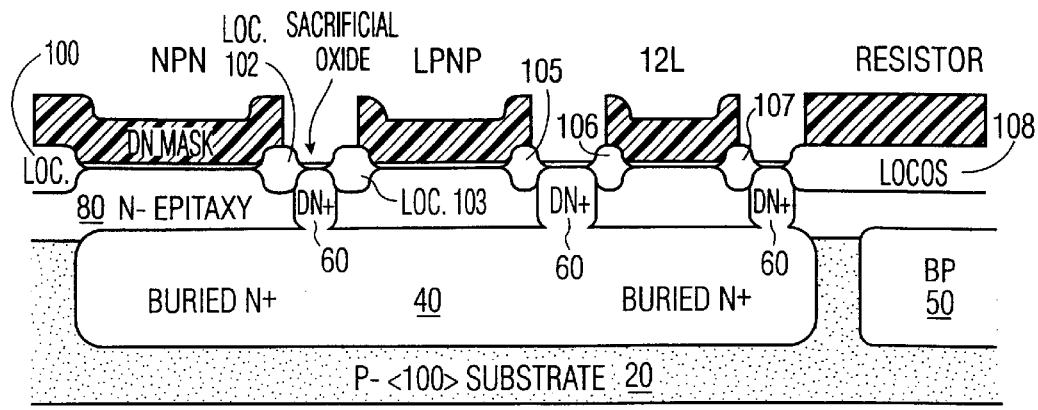
Figure 6E:
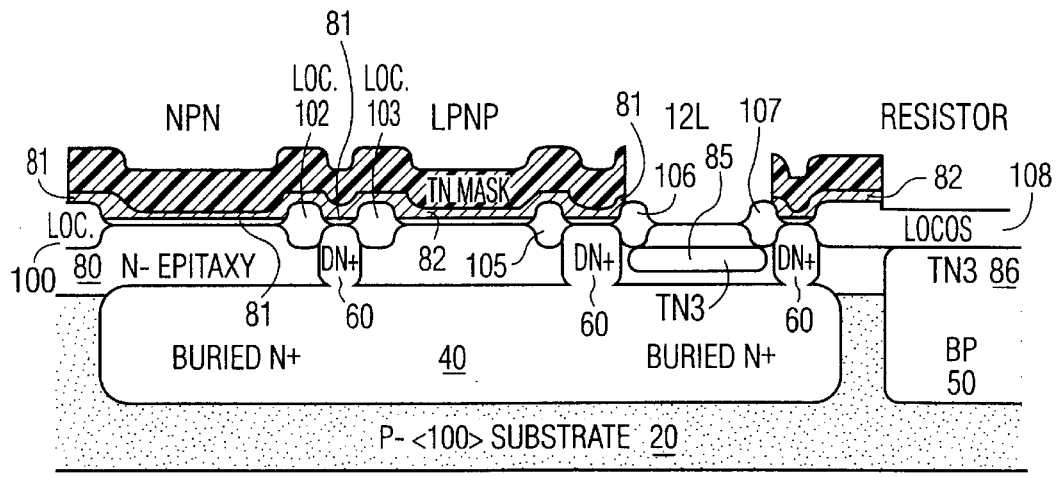

FIG. 6D: The OD resist is stripped, field oxide regions 100–108 are formed, the structure is subjected to an oxide, nitride, oxide (ONO) etch, sacrificial oxide is formed, a deep N+ mask is applied, and deep N+ (DN) regions 60 are implanted.

6E: The DN mask is stripped, the DN implant is annealed, the sacrificial oxide is removed, gate oxide regions 81 are formed, and a thin alpha silicon layer 82 is deposited. A threshold N (TN) mask is applied, and p+ conductivity TN3 regions 85, 86 are formed. This will form the field implant as well as the base implant of the upside down NPN transistor 110 in the I2L device. The base link occurs in the TN3 region 85, which will link the base region with the collectors as will be seen subsequently herein. Additionally, TN3 region 86 will link up with BP region 50 so that the entire region is of p-type conductivity. This combination of BP and TN3 regions provides isolations between active devices. An I2L base etch is performed to open the upside down NPN transistor base area and remove the thin silicon 82 and the gate oxide 81.

Figure 6F:
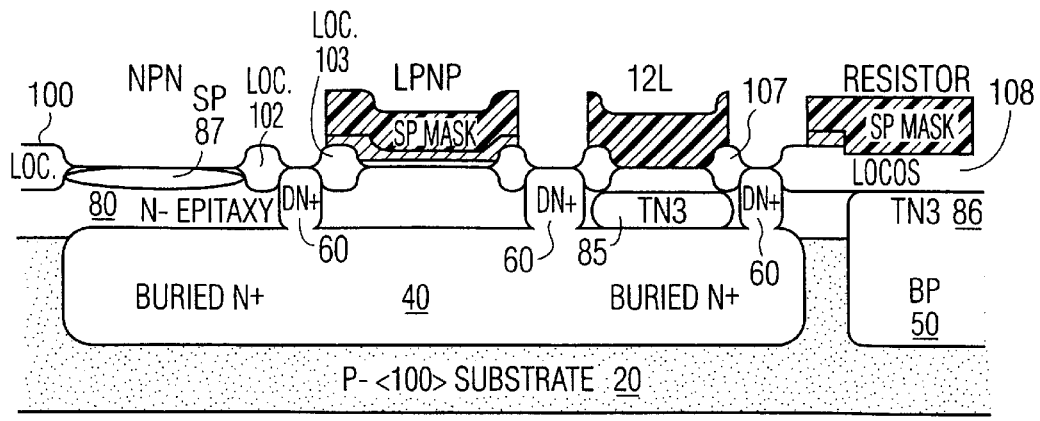

FIG. 6F: A shallow P (SP) bipolar mask is applied and a SP etch is performed to open the bipolar base areas. Shallow P region 87 (shallow p base SP) is formed by ion implant, the SP mask is removed, and the SP region is annealed to activate the base.

Figure 6G:
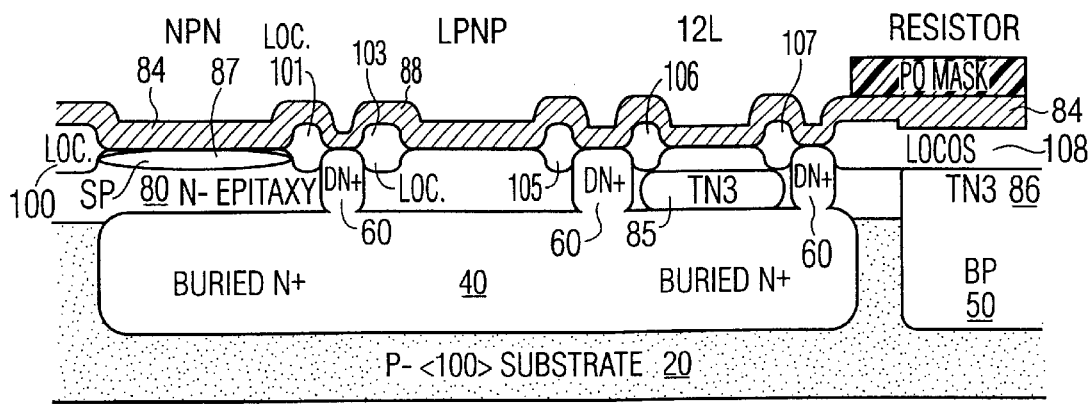

FIG. 6G: a thick alpha silicon (polysilicon) layer 84 is deposited, a boron silicon blanket implant is made to set up the resistors, a polyoversize (PO) implant mask is applied, an Arsenic PO implant is performed, and the PO mask is stripped.

Figure 6H:
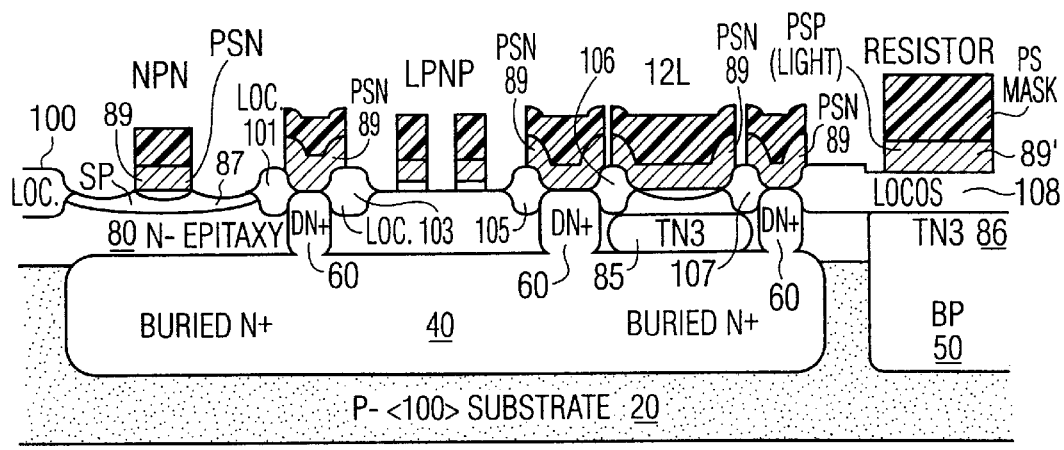

FIG. 6H: A polysilicon (PS) mask is applied and a polysilicon etch performed to form the emitter of the regular NPN transistor and the collectors 89 of the upside down NPN transistor as well as the resistor. Polysilicon regions 89 which are implanted with the arsenic PO implant, are of the N-conductivity type (PSN), and are the emitters of a regular NPN transistor and the collectors of the upside down NPN transistor 110 of the I2L device, and polysilicon region 89', the portion of the polysilicon implanted by boron blanket implant only and are therefore lightly doped to be of P-conductivity type, forms the resistor. The PS mask is stripped, and the emitter region annealed.

Figure 6I:
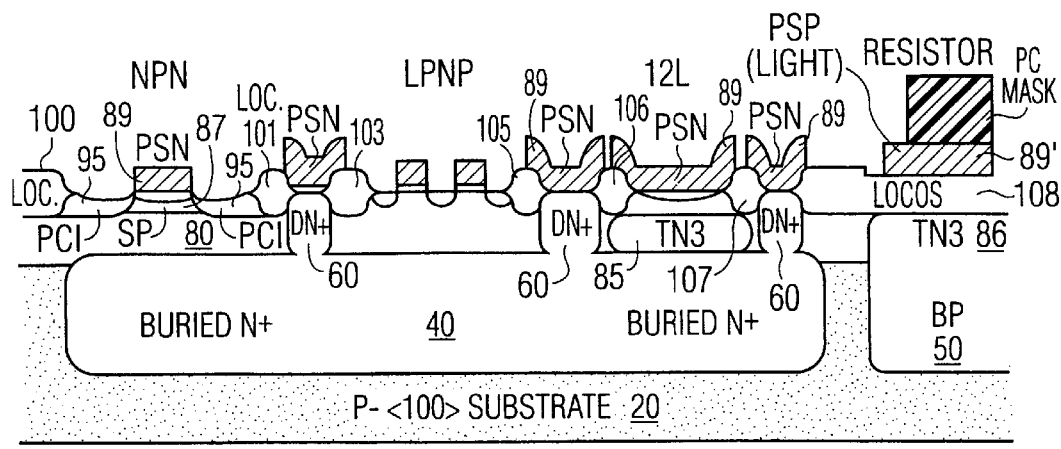
Figure 6J:
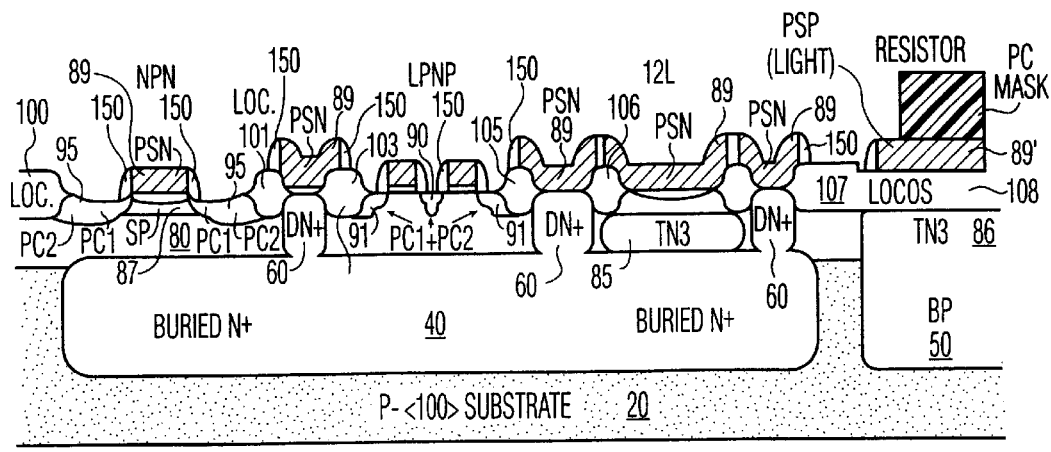

FIGS. 6I–6J: PC masks covering the resistor are formed, after which p+ type regions of conductivity PC1 and PC2 are implanted to form the emitter/collector of the LPNP device, the extrinsic base contact of the regular NPN transistor 111, and the extrinsic base contact of the upside down NPN transistor 110. The mask is removed, and a PC2 anneal is performed. Preferably a cap oxide is applied prior to implanting the PC2 region to prevent outgassing of this subsequently applied PC2 region during anneal. TEOS oxide spacer regions 150 are formed on the polysilicon regions 89 and 89'.

Figure 6K:
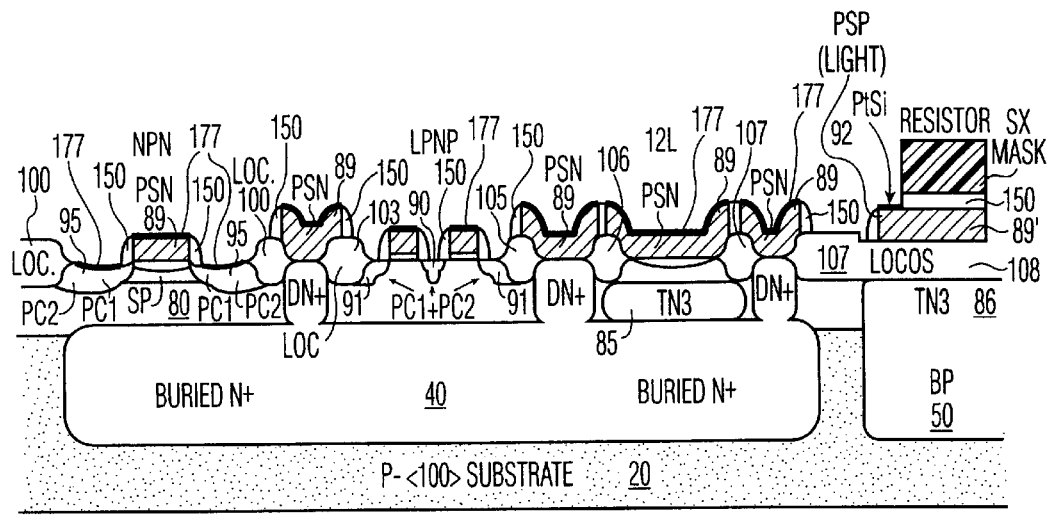

FIG. 6K: The structure is subjected to a further anneal to activate the PC1 and PC2 implants (Q anneal), a silicide exclusion mask (SX mask) is applied to cover the resistors, the structure is etched to open areas where silicide is desired, platinum is deposited and sintered to formed the silicide layer platinum silicide 177. It will be noted that aside from the silicide present on the polysilicon, which is substantially benign in the device, the only other silicide present in the device illustrated in FIG. 3B, for example, is the layer 177 overlying the p+ regions 90,91 and 92.

Figure 6L:
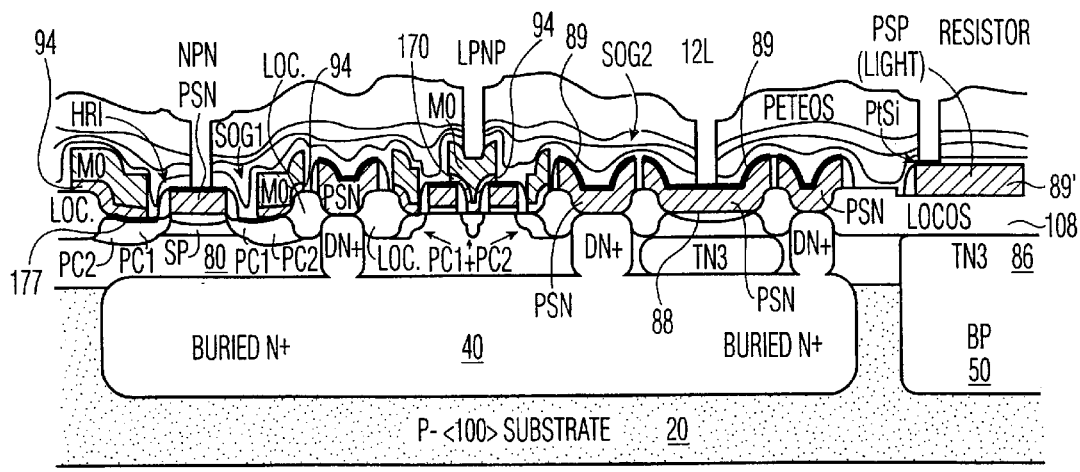

FIG. 6L: Platinum is stripped, TiW barrier metal 94 is deposited, AlCu (MO) is sputtered, metal mask (MO)mask is applied, the structure is subjected to a MO etch, a high reflective index (HRI) silane based oxide region is deposited, after which spin on glass regions, SOG1 and SOG2, are deposited and cured. CO glass (PTEOS) and CO mask are applied, an etch defining the contact region is performed, and the CO mask removed.

Figure 6M:
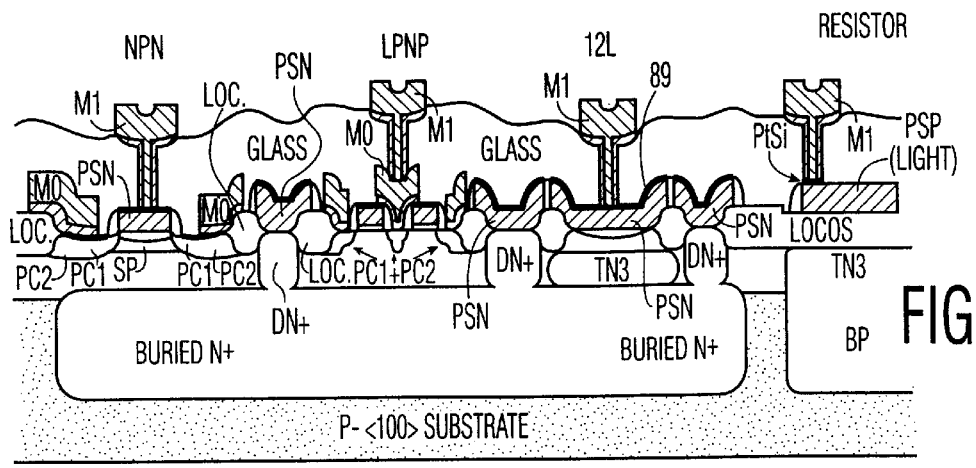

FIG. 6M: The contact metal (M1), which may be selected from sputtered and CVD deposited Ti, TIW, W, AlCu and layers of any or all of these metals, is deposited, a M1 mask is applied, M1 etch is performed, and the resist is stripped.

Figure 6N:
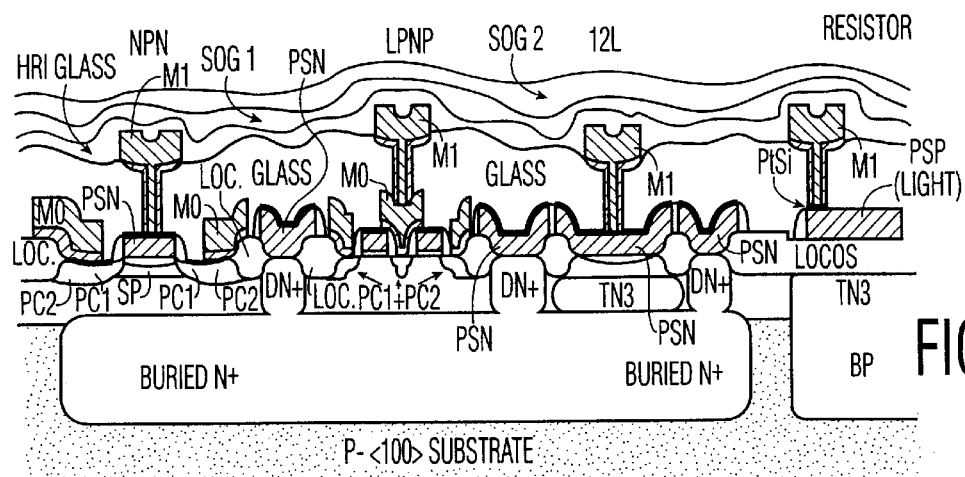
Figure 6O:
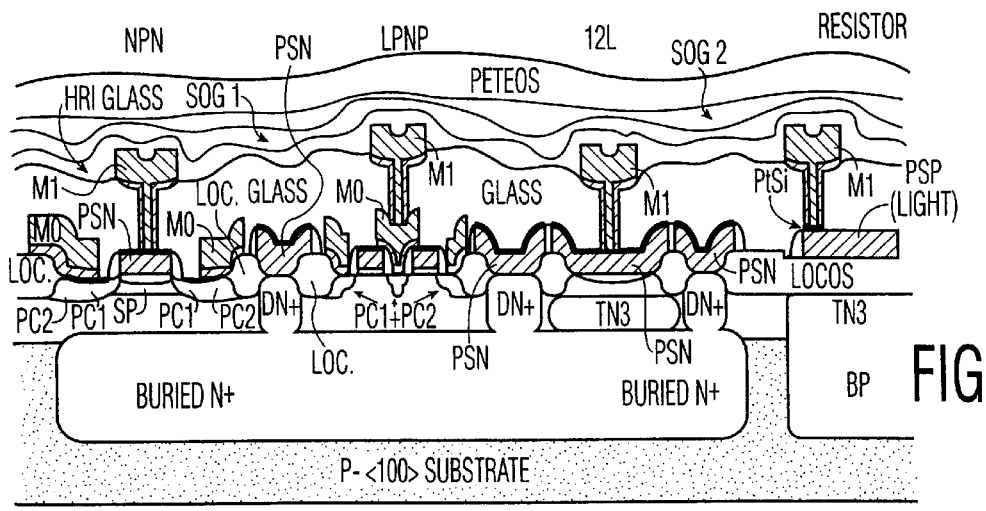

FIGS. 6N–6O: A high reflective index (HRI) silane based oxide region is deposited, after which spin on glass regions, SOG1 and SOG2, are deposited, cured, and etched back. M1 glass (PTEOS) is applied.

Figure 6P:
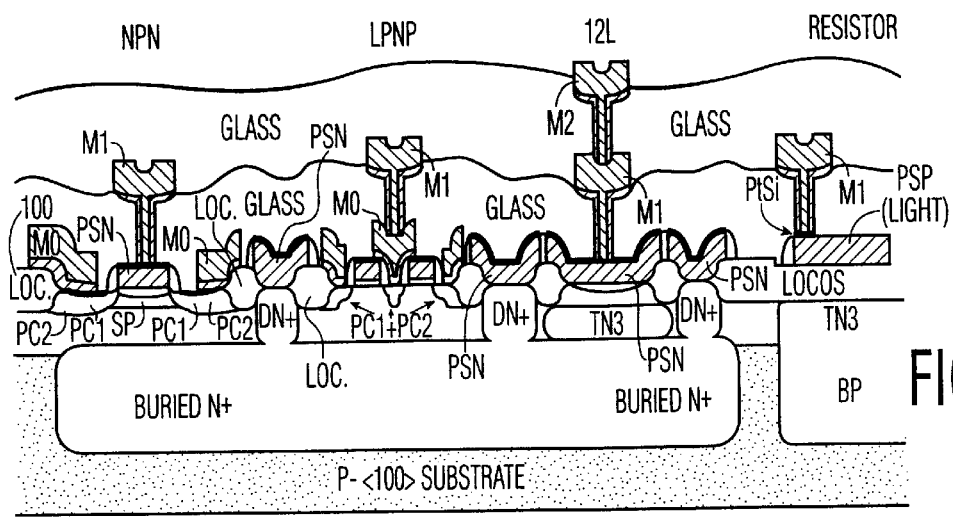
Figure 6Q:
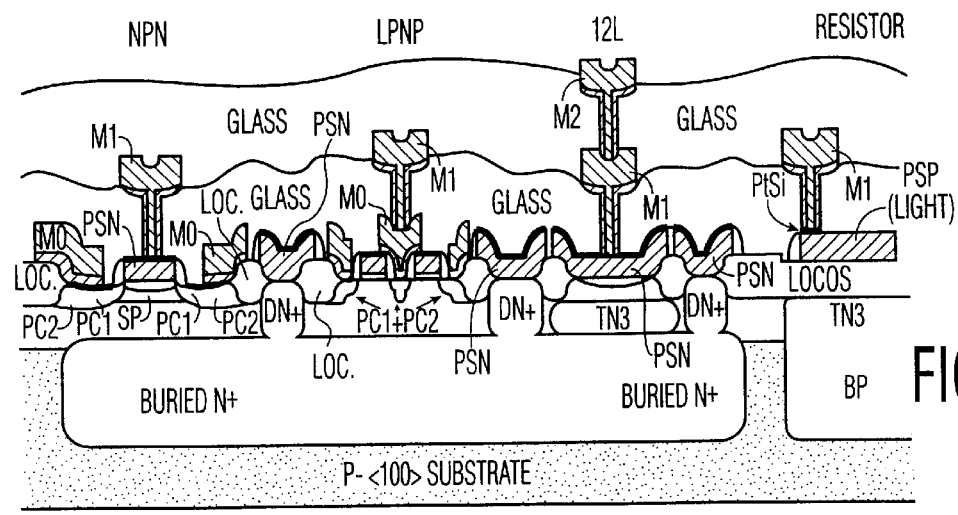
Figure 6R:
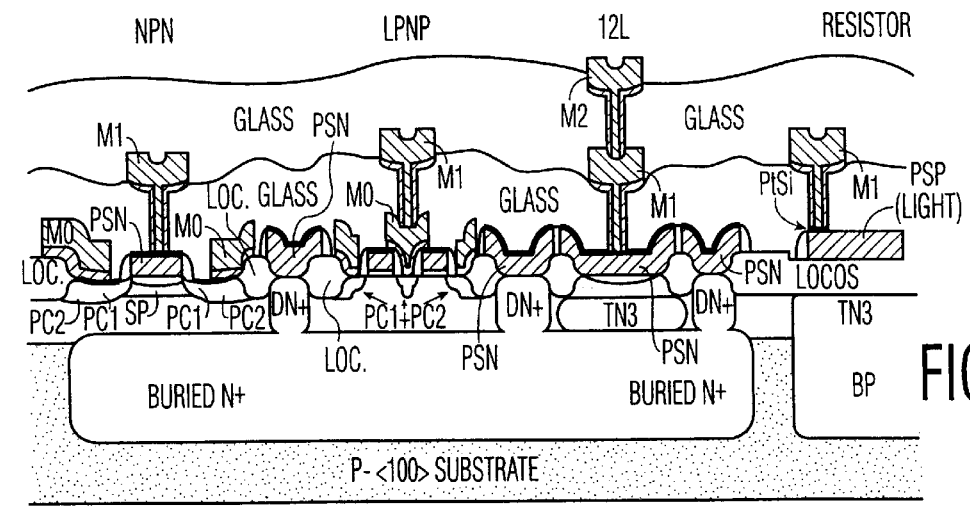

FIGS. 6P–6R: A via mask is applied, and the structure is etched to form the via (not shown), and the resist is removed. M2 metal (Ti,TiW) is deposited by sputtering, a M2 mask is applied, the M2 etch is performed, and the resist removed.

Subsequent steps of annealing (alloying), and applying passivation masks and etches may be performed as necessary and/or as desired.

Although the invention has been described and illustrated with the metal base contact 170 positioned between field oxides 102 and 103 or STI isolation devices 202 and 203, it will be realized that the devices of the invention are not limited in having the metal base contact so positioned, and it is possible to have an effective linkup and functional device with the metal base contact positioned between any of the field oxides or STI devices illustrated.

The invention may be embodied in other specific forms without departing from the spirit and scope or essential characteristics thereof, the present disclosed examples being only preferred embodiments thereof.

We claim:

1. A method for the preparation of a semiconductor device which comprises the steps of:

(1) providing a silicon substrate of P-type conductivity (20), and forming an ion-implanted buried N+ region (40) thereon;

(2) forming an ion-implanted BP region (50);

(3) forming an N-epitaxial layer (80) over said BN region (40) and said BP region (50);

(4) implanting in said epitaxial region (80) deep N+ (DN) regions (60);

(5) forming TN3 regions of p-type conductivity (85, 86) to form the field implant and the base implant of an upside down NPN transistor of an I2L device, the base link occurring in the TN3 region (85);

(6) performing a I2L base etch to open the I2L base area and further etching to open bipolar base areas;

(7) forming shallow P base region (87), depositing a polysilicon layer, performing a boron silicon implant, and forming an arsenic implant region;

(8) etching selective areas of the polysilicon layer to form the emitters of a regular NPN transistor (111) and the collectors (89) of the upside down NPN transistor (110) of the I2L device in the arsenic implant regions of the polysilicon, and to form resistors (89') from the boron implanted regions of the polysilicon;

(9) forming implanted p+ type regions of conductivity PC1 and PC2 (90,91,92) to form the emitter/collector (90,91) of the LPNP transistor;

(10) selectively etching and depositing metal to form silicide layers (177) overlying said p+ regions (90,91, 92); and

(11) forming a contact region and depositing a contact metal (170) on the surface of the structure overlying silicide layer (177) and p+ region (92).

* * * * *